(12) United States Patent
Tas et al.

(10) Patent No.: US 9,448,119 B2
(45) Date of Patent: Sep. 20, 2016

(54) RADIATION THERMOMETER USING OFF-FOCUS TELECENTRIC OPTICS

(75) Inventors: Guray Tas, Flanders, NJ (US); Jing Zhou, Bridgewater, NJ (US); Daewon Kwon, Whippany, NJ (US)

(73) Assignee: Veeco Instruments Inc., Plainview, NY (US)

( * ) Notice: Subject to any disclaimer, the term of this patent is extended or adjusted under 35 U.S.C. 154(b) by 82 days.

(21) Appl. No.: 13/531,162

(22) Filed: Jun. 22, 2012

(65) Prior Publication Data

US 2013/0343425 A1 Dec. 26, 2013

(51) Int. Cl.
G01J 5/00 (2006.01)
G01J 5/08 (2006.01)
G01J 5/06 (2006.01)
C23C 16/44 (2006.01)

(52) U.S. Cl.
CPC .............. *G01J 5/0831* (2013.01); *C23C 16/44* (2013.01); *G01J 5/0007* (2013.01); *G01J 5/06* (2013.01); *G01J 5/0806* (2013.01); *G01J 5/0859* (2013.01)

(58) Field of Classification Search
USPC ......... 374/121, 123, 130, 131; 250/201, 204
See application file for complete search history.

(56) References Cited

U.S. PATENT DOCUMENTS

| | | | |
|---|---|---|---|
| 4,729,668 A * | 3/1988 | Angel et al. .................. 374/161 |
| 5,209,570 A | 5/1993 | Neuhaus |
| 6,310,347 B1 | 10/2001 | Shu et al. |
| RE37,546 E * | 2/2002 | Mahawili ........................ 427/10 |
| 6,349,270 B1 | 2/2002 | Gurary et al. |
| 6,492,625 B1 | 12/2002 | Boguslavskiy et al. |
| 6,614,539 B1 * | 9/2003 | Shimizu ........................ 356/609 |
| 6,742,927 B2 * | 6/2004 | Bellifemine .................. 374/121 |
| 7,345,814 B2 * | 3/2008 | Yoneyama et al. ........... 359/383 |
| 7,443,496 B2 * | 10/2008 | Noguchi et al. ........... 356/237.2 |
| 7,728,968 B2 * | 6/2010 | Tsai et al. .................. 356/237.5 |
| 7,837,383 B2 * | 11/2010 | Taylor et al. ................. 374/121 |
| 8,152,365 B2 * | 4/2012 | Timans ........................ 374/130 |
| 2002/0106000 A1 * | 8/2002 | Morisaki et al. ............. 374/129 |
| 2007/0020784 A1 * | 1/2007 | Timans ........................... 438/16 |
| 2007/0291816 A1 | 12/2007 | Volf et al. |
| 2008/0030715 A1 * | 2/2008 | Kondo et al. ................... 356/73 |
| 2008/0198895 A1 | 8/2008 | Davis et al. |
| 2010/0292951 A1 * | 11/2010 | Gaertner et al. ............. 702/135 |

(Continued)

OTHER PUBLICATIONS

Search Report/Written Opinion, PCT/US2013/047024, dated Sep. 25, 2013, 18 pages.

(Continued)

*Primary Examiner* — Lisa Caputo
*Assistant Examiner* — Nasir U Ahmed
(74) *Attorney, Agent, or Firm* — Patterson Thuente Pedersen, P.A.

(57) ABSTRACT

A radiation thermometer utilizing an off-focus telecentric lens arrangement in chemical vapor deposition reactors. An object assembly of one or more optical components is positioned at a distance equal to its focal length from an aperture stop. The aperture stop is dimensioned so that the chief rays are substantially parallel with the optical axis of the object assembly, and so that the rays that pass through the aperture stop define a narrow solid angle about the chief rays. The off-focus telecentric arrangement thus configured is focused at infinity, but is utilized to capture radiation from a relatively proximate target (e.g., within a couple meters) that is out of focus. The capture of collimated radiation from the target diminishes the contribution of stray radiation, particularly with targets having a highly specular surface.

18 Claims, 3 Drawing Sheets

(56) References Cited

U.S. PATENT DOCUMENTS

2011/0064114 A1 3/2011 Zettler et al.
2011/0181730 A1 7/2011 Cabib et al.

OTHER PUBLICATIONS

Edmund Optics at http://www.edmundoptics.pdf, 3 pages, as accessed on Apr. 24, 2012.
Schneider Optics at https://www.schneideroptics.com/ecommerce/CatalogSubCategoryDisplay.aspx?CID=1439, one page as accessed on Jun. 16, 2012.
"Ultraviolet pyrometer maps wafer temperature"; Jun. 2007.
Petrozzo, Ronald A. et al.; Secured—"Telecentric Lenses simply non contact metrology"; www.tmworld.com, 4 pages, Oct. 15, 2001.
Petrozzo, Ronald A. et al.; Unsecured—"Telecentric Lenses simply non contact metrology"; www.tmworld.com, 4 pages, Oct. 15, 2001.
Creighton, J.R. et al.; "Improved InGaN Epitaxy Yield by Precise Temperature Measeurement", Final Report for Project: DE-FC26-05NT42285; 29 pages; Reporting Period Start Date: Oct. 1, 2004, Reporting Period End DateL Nov. 30, 2006.
Tempsens Instruments; Pyrometry Fundamentals, pp. 59-68; prior to Jun. 2012.
Lenhardt, Dr. Karl et al.; "Optical Measurement Techniques with Telecentric Lenses"; 61 pages; prior to Jun. 2012.
Koleske, Daniel D.; "Improving Eptiaxial Growth for LEDs", Sandia National Laboratories, 2008, DOE Solid-State Lighting R&D Workshop, Jan. 30, 2008; 16 pages.
Creighton, J.R. et al.; "Emissivity-correcting near-UV pyrometry for group-III nitride OMVPE", available online Nov. 28, 2005.
Application and File Histopry of U.S. Appl. No. 13/531,220, filed Jun. 22, 2012, Inventors Guray Tas et al.
Mitrovic, B. et al."Reactor Design Optimization based on 3D CFD Modeling on Nitrides Deposition in MOCVD Vertical Rotation Disc Reactors", Jun. 2005.
Application No. SG11201408492Q, Written Opinion dated Nov. 10, 2015, 7 pages.

\* cited by examiner

RADIATION THERMOMETER USING OFF-FOCUS TELECENTRIC OPTICS

FIELD OF THE INVENTION

The disclosure is directed generally to radiation thermometers or pyrometers, and more specifically to collection optics used therefor.

BACKGROUND

Metalorganic Chemical Vapor Deposition (MOCVD) is a chemical vapor deposition technique for growing crystalline layers in processes such as the production of semiconductors. The MOCVD process is implemented in a reactor chamber with specially designed flow flanges that deliver uniform reactor gas flows to the reactor chamber.

The temperature of the crystalline layers during the MOCVD process are typically measured using non-contact devices such as radiation thermometers or pyrometers. Such crystalline growth materials include silicon carbide (SiC), zinc selenide (ZnSe), and gallium nitride (GaN) based materials such as GaN and AlGaN. Certain substrates crystalline growth materials have emission characteristics that limit the wavelength of operation for radiation thermometry. For example, GaN, grown on a sapphire substrate, can have a transmittance greater than 50% for wavelengths longer than 450 nanometers (nm) at process temperatures. Thus, at wavelengths longer than 450 nm, a substantial fraction of the radiation leaving the surface of a GaN layer originates from the structure beneath the substrate that is in the line of sight of the radiation thermometer (e.g., a wafer carrier). Radiation that passes through the GaN layer is not indicative of the temperature of the GaN layer. Accordingly, radiation thermometers have been developed that detect radiation at wavelengths lengths shorter than 450 nm (corresponding roughly to the blue, violet and ultraviolet wavelengths). See, e.g., U.S. Patent Application Publication No. 2011/0064114 to Zettler et al. (hereinafter "Zettler"), disclosing a pyrometer adapted to detect radiation in the range of 250 nm to 450 nm.

An issue with the use radiation thermometers is the detection of unwanted radiation. One source of unwanted radiation is unfiltered radiation that detected from outside the desired band pass of detection. Zettler describes an apparatus and technique that accounts for the contribution of unfiltered radiation. Zettler points out that narrow band pass filters do not totally block infrared radiation. The unblocked infrared radiation can be problematic at the temperatures of operation (about 800° C.) because the blackbody intensity of the radiation in the infrared portion of the electromagnetic spectrum is about 9 orders of magnitude higher than in the primary band pass (i.e., the desired spectral band pass for inferring target temperature) of the narrow band pass filter. The method of Zettler involves the use of a detector that is sensitive over a broad wavelength range (from ultraviolet to the infrared) and filtering the incoming radiation with a narrow band pass filter centered near 410 nm. A longpass filter is then used to effectively block the primary band pass of the narrow band pass filter, but still allow the radiation unfiltered by the narrow band pass filter in the infrared and the near-infrared portions of the electromagnetic spectrum to pass. Zettler infers the radiation that passes through the primary band pass of the narrow band pass filter as the difference between the two measurements, i.e., between the signal attained with only the narrow band pass filter and the signal attained with both the narrow band pass filter and the longpass filter.

Another source of unwanted radiation is the contribution of "stray radiation." Stray radiation is reflected radiation that is redirected onto the target by the enclosure or other structures therein via inter-reflection and reflected into the line-of-sight of the radiation thermometer. Consider a wafer carrier with GaN wafers that are being heated to an elevated temperature of 800° C. by, for example, a microwave heating process. The components operating at the elevated temperature, such as the wafer carrier and wafers, will emit radiation in all directions, causing radiation to inter-reflect within the chamber. Some of the inter-reflected radiation will be incident on the surface targeted by the radiation thermometer and contribute to the radiation detected by the radiation thermometer. For GaN crystalline layers at 800° C., the reflectance at 410 nm is approximately 0.2. The stray radiation contribution can significantly bias the temperature value indicated by the radiation thermometer.

Stray radiation is enough of an issue when the target is at or near the maximum temperatures within the chamber, which is the case in microwave heating systems. However, when measuring radiation at or near the short wavelengths of the visible spectrum (i.e., in the blue, violet or ultraviolet wavelengths), the problem becomes exacerbated when there are other sources within the chamber that are operating at substantially higher temperatures than the target. Such a heating arrangement transfers heat in accordance with the first law of thermodynamics, which requires that the resistance heating element operate at a temperature that is significantly higher than the crystalline growth layer. An advantage of thermal radiative heating is that the radiation intensity can be tailored to have a profile across the wafer carrier that promotes uniformity of the temperature.

Figure 1:
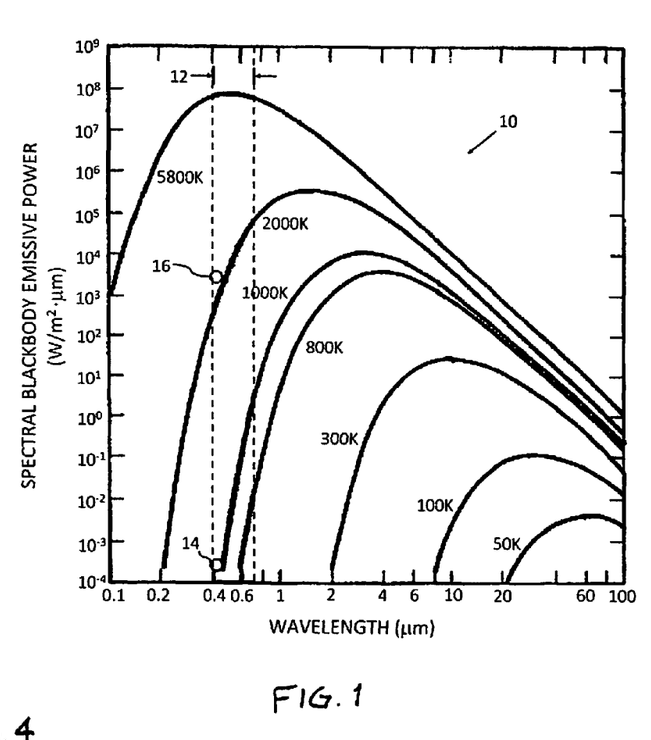
FIG. 1 is a graph of spectral blackbody emissive power according to Planck's law at various temperatures.

Consider, for example, the blackbody radiation of a crystalline growth layer at 800° C. According to Planck's law, the blackbody spectral emissive power at 410 nm and 800° C. is about $2.0 \times 10^{-4}$ watts/m$^2 \cdot \mu$m. Now consider a heating source such as a resistance heating element that transfers heat to the crystalline growth layer via radiation and convection that operates at 1800° C. The blackbody spectral emissive power at 410 nm and 1800° C. is about $1.4 \times 10^3$ watts/m$^2 \cdot \mu$m. That is an increase of about 7 orders of magnitude over the blackbody spectral emissive power at 800° C. (a typical operating temperature for crystalline growth layer during CVD operations) at the wavelength of interest (FIG. 1). Accordingly, even if only a fraction of a percent of the radiation at the 410 nm wavelength finds its way onto the detector of the radiation thermometer, the bias to the indicated temperature can be significant. Thus, the stray radiation contribution in chambers that utilize resistance heating elements can be of the same order of magnitude as the unfiltered radiation contribution identified by Zettler.

Zettler, however, is silent with respect to the contribution of stray radiation, or the effects of having radiation sources within a chamber that can effectively overwhelm the radiation that is emitted from the target. Rather, Zettler treats the target as though it is freely radiating (i.e., has no reflectance contribution). In fact, a target within a CVD chamber at that is operating at the temperatures required for crystalline growth is not freely radiating.

A radiation thermometer tailored to reduce the effects of unwanted radiation, not only due to unfiltered radiation, but also due to stray radiation, would be welcomed.

SUMMARY OF THE INVENTION

Various embodiments of the invention utilize a so-called "telecentric" optical arrangement, but in an off-focus manner, to limit the contribution of reflected stray radiation in at least three different aspects. First, in a telecentric optical arrangement, the chief rays that are captured from the target are substantially parallel to the optical axis, which substantially limits the stray radiation contribution, particularly if the target has a strong specular reflectivity component. Second, telecentric optical arrangements can also be tailored so that the solid angle subtended by each point on the target is quite small, which also reduces the contribution of stray radiation. Third, the telecentric optical arrangement can be configured to capture a collimated beam of radiation that is emitted from the target, which further reduces the solid angle of radiation captured by the radiation thermometer while increasing the size of the target (and the subsequent signal-to-noise ratio) to the effective diameter of the forward optical elements. In capturing the collimated beam of radiation, the telecentric optical arrangement is utilized in an "off-focus" manner, i.e., is not used for high quality imaging of the surface of the target. Therefore, the components utilized in the telecentric optical arrangement need not be of the superior quality typically associated with commercially available telecentric lens systems.

Commercially available telecentric lens systems that are utilized, for example, in machine vision systems to provide clear, crisp images of high magnification. These telecentric lens systems provide uniform magnification of all points within an image, regardless of the location of the point within that image. That is, telecentric lens systems used in machine vision systems provide images that are substantially isometric, as opposed to perspective images that are provided with standard imaging systems. One advantage of commercially available telecentric lens systems is that the isometric image can substantially reduce parallax within the image.

However, the effective range over which a telecentric lens system can provide an isometric image at a given setting is quite limited. This effective range is commonly referred to as the "telecentric depth" (see, e.g., Petrozzo et al., "Telecentric Lenses Simplify Non-Contact Metrology," Test & Measurement World, Oct. 15, 2001, p. 5). Thus, a paradigm of telecentric lens systems is that they are operable over a narrow range centered about the object plane. The optical components of a machine vision telecentric lens system are of high quality to provide crisp, clear images over the entire image. Furthermore, commercially available telecentric lens systems typically utilize high quality mountings to provide the ability to adjust the focal depth of the object plane. The precise imaging capabilities of commercially available telecentric lens systems drive up the cost.

For various embodiments of the invention, the telecentric concept is utilized in a way that machine vision systems are not. In one embodiment, the telecentric optical arrangement configured for focusing at infinity while being arranged only a few centimeters from the target. The advantage of this arrangement is that the radiation from each points on the target have substantially the same angle entering the optical system. High quality imaging and the costly optics associated therewith is not needed because the objective is radiation collection and detection rather than object imagery. That is, the telecentric optical arrangement is utilized in an "off-focus" manner to effectively capture a collimated beam of radiation that is emitted from the target surface. Such an arrangement requires neither high quality imaging optics nor sophisticated mountings for fine tuning an image.

Structurally, in various embodiments of the invention, an off-focus telecentric optical arrangement includes an aperture stop and a first or "object" optical component assembly (herein referred to as the "object assembly") of one or more optical components. The aperture stop and object assembly can define an optical axis and a first focal length relative to a reference point within the object assembly, the reference point being located on the optical axis. In one embodiment, the aperture stop is located at a distance from the reference point of the object assembly that is substantially equal to the first focal length of the object assembly. By locating the aperture stop at the focal length of the object assembly, the object assembly is focused effectively at infinity for transfer of substantially collimated radiation from an off-focus target through the object assembly and for focusing of the radiation from the off-focus target onto the aperture stop.

In some embodiments, a second or "image" optical component assembly (herein referred to as the "image assembly") of one or more optical components can be located opposite said object assembly from said aperture stop and arranged to receive radiation transferred from the object assembly through the aperture stop along the optical axis, the image assembly defining a second focal length relative to a second reference point within the image assembly, the second reference point being located on the optical axis.

In one embodiment, a "bilateral" telecentric optical arrangement is implemented, in which the chief rays of both the target and the image are parallel to the optical axis. In the bilateral arrangement, the focal length of the object assembly defines approximately the target distance, the aperture stop being located at essentially the back focal plane of the object assembly and at the front local plane of the image assembly. In a bilateral telecentric arrangement, not only is the radiation collected through the object optical component assembly substantially collimated, but the radiation transferred from the image optical component assembly to the detector is also substantially collimated. An advantage of collimating the radiation between the image optical component assembly and the detector is additional rejection of stray light.

In various embodiments, the off-focus telecentric optical arrangement is provided as a kit for implementation with a new or an existing radiation thermometer in chemical vapor deposition systems. In one embodiment, a telecentric lens arrangement is provided that includes an aperture stop and a forward optical component assembly for collecting radiation from a target, the telecentric lens arrangement being adapted for positioning the aperture stop at the focal length of the forward optical component assembly. Manufacturer-supplied instructions are also provided that instruct the user to orient the forward optical component assembly to intercept radiation emitted from a target within a chemical vapor deposition chamber. In one embodiment, coupling the telecentric lens arrangement with a radiation detector and/or the positioning the aperture stop at the focal length of the forward optical component assembly is performed by the manufacturer; in other embodiments, the step of positioning the aperture stop at the focal length of the forward optical component assembly and/or positioning the aperture is provided on the manufacturer-supplied instructions.

DETAILED DESCRIPTION

Referring to FIG. 1, a family of curves 10 depicting the spectral blackbody emissive power in accordance with Planck's law at various temperatures is presented. The visible spectral region 12, coinciding approximately with the 400 nm to 700 nm wavelength band, is also identified in FIG. 1. In relation to the previous discussion of the effect of temperature on the blackbody emissive power at 410 nm, first and second reference points 14 and 16 are identified in FIG. 1 at 1073 K and 2073 K, respectively (corresponding to 800° C. and 1800° C., respectively).

Figure 2:
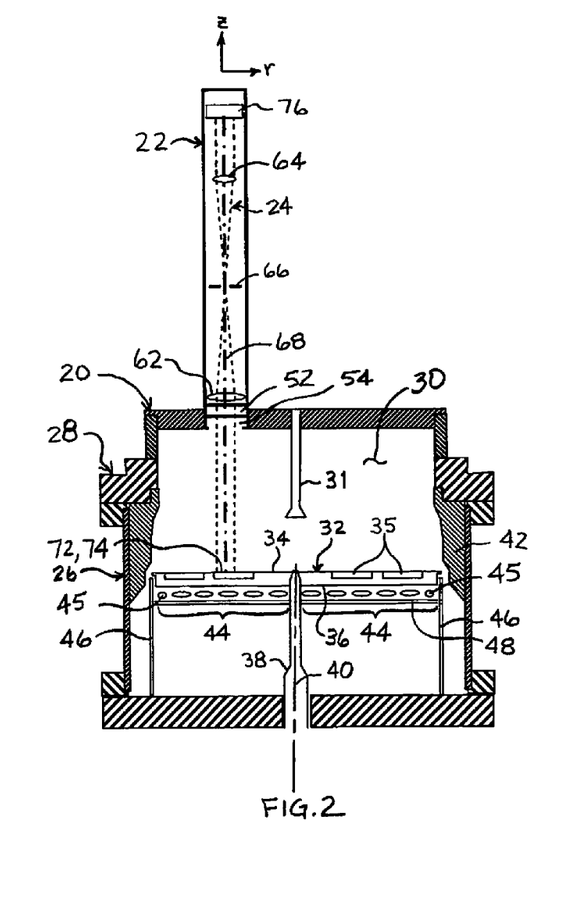
FIG. 2 is a sectional view of an off-focus telecentric radiation thermometer operatively coupled to a MOCVD chamber in an embodiment of the invention.
Figure 3:
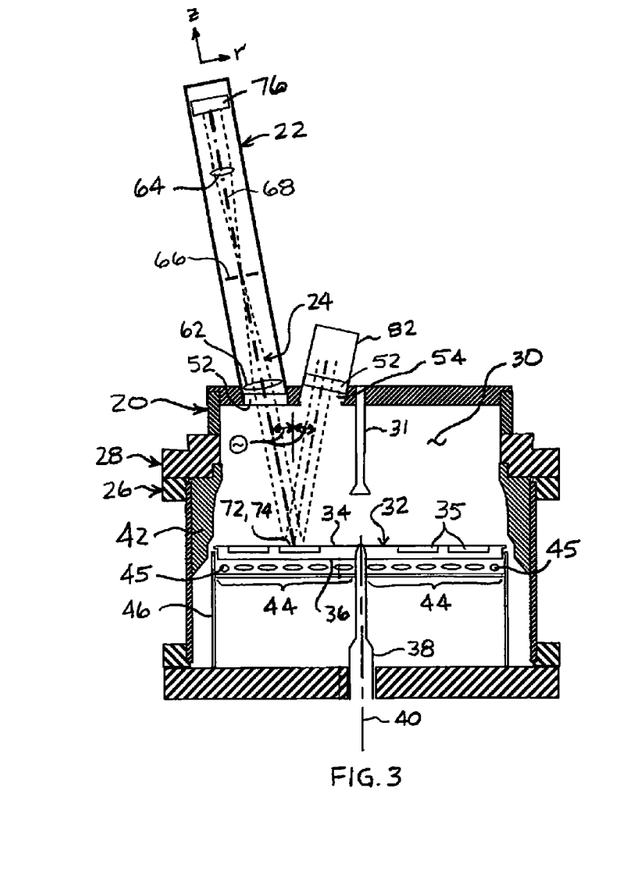
FIG. 3 is a sectional view of an off-focus telecentric radiation thermometer and light trap operatively coupled to a MOCVD chamber in an embodiment of the invention.

Referring to FIGS. 2 and 3, a MOCVD reactor system 20 utilizing a radiation thermometer 22 having an off-focus telecentric optical arrangement 24 is depicted in embodiments of the invention. The MOCVD reactor system 20 includes a reactor chamber 26 operatively coupled with a flow flange 28 to define an enclosure 30. The flow flange 28 includes laminar flow plates 31 through which the gases for the MOCVD process are introduced into the reactor chamber 26. Disposed within the reactor chamber 26 is a wafer carrier 32 having a top surface 34 defining wafer pockets 35 and a bottom surface 36 and operatively coupled with a spindle 38 that defines a rotation axis 40. A body shutter 42 can be removably inserted adjacent the interior wall of the reactor chamber 26 and surrounds the wafer carrier 32.

A resistance heating array 44 is disposed beneath the wafer carrier 32 for radiative coupling with the bottom surface 36 of the wafer carrier 32. The resistance heating array 44 can include a peripheral heating element 45 and can be surrounded by a cylinder 46 and also bounded beneath with a reflector plate 48 to enhance radiative coupling between the resistance heating array 44 and the wafer carrier 32.

The radiation thermometer 22 is mounted atop the flow flange 28 and oriented to view the top surface 34 of the wafer carrier 32 through a view port window 52. In one embodiment, the view port window 52 is disposed in a recess 54, which can be actively cooled.

The off-focus telecentric optical arrangement 24 includes a first or forward optical component assembly 62 (herein referred to as the "object assembly" 62) and a second or rearward optical component assembly 64 (herein referred to as the "image assembly" 64). The object assembly 62 is characterized as having an effective radial dimension 65 (FIG. 4), i.e., the maximum radial dimension over which the object assembly 62 effectively transfers radiation onto an aperture stop 66.

The aperture stop 66 is disposed between the object and image assemblies 62 and 64. In one embodiment, the object and image assemblies 62 and 64 and the aperture stop 66 are arranged concentrically along an optical axis 68. The optical axis 68 is the axis about which radiation detected by the radiation thermometer 22 propagates. The optical axis 68 can be straight, such as depicted herein, or can be tortuous, for example when planar or focusing mirrors are implemented for the transfer of radiation. The optical axis 68 can be centered about a target 72, characterized as having a target area 74. The radiation thermometer 22 also includes a detector 76 for detecting electromagnetic radiation.

It is noted that, for purposes of this disclosure, an "optical component assembly" can comprise a plurality of optical components (as depicted), or can comprise a single optical component such as a single lens. While the optical components depicted herein comprise lenses, it is understood that other optical components, such as focusing mirrors and fiber optic bundles can also be utilized to achieve the radiation transfer.

In one embodiment, the radiation thermometer 22 is oriented so that the optical axis 68 is substantially normal to the top surface 34 of the wafer carrier 32 (FIG. 2). In another embodiment, the radiation thermometer 22 is oriented so that the optical axis 68 is at an acute angle 78 relative to a direction normal to the top surface 34 of the wafer carrier 32 (FIG. 3). In one embodiment, a light trap 82 is arranged at a mirrored angle of the optical axis 68 (FIG. 3) in three-dimensional space. That is, the light trap 82 is arranged to subtend a reflection of the optical axis 68 from a hypothetical mirrored surface at the top surface 34 of the wafer carrier 32.

Figure 4:
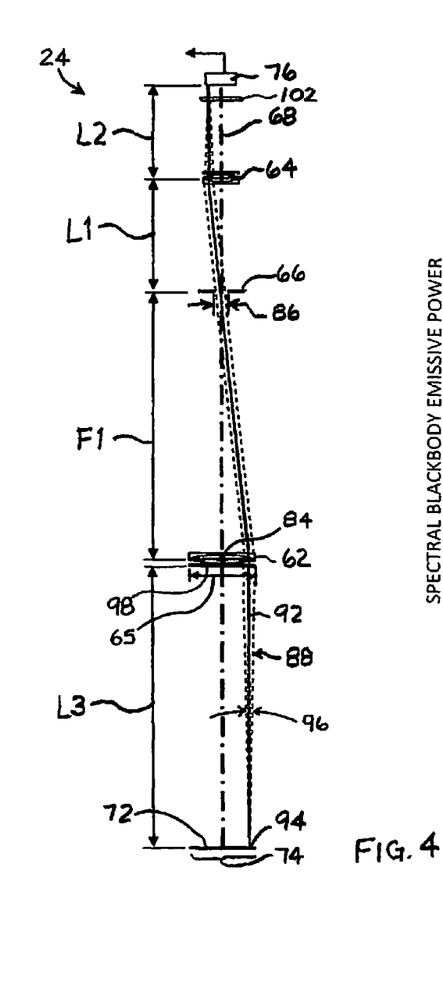
FIG. 4 is an off-focus telecentric optical arrangement in an embodiment of the invention.

Referring to FIG. 4, the off-focus telecentric optical arrangement 24 of the radiation thermometer 22 is described in greater detail. The object assembly 62 is characterized as having a focal length F1 that is measured from a reference point 84 on the optical axis that is on or within the object assembly 62. A "focal length" is the distance from the reference point 84 at which rays parallel to the optical axis 68 passing through by the object assembly 62 are focused. For the off-focus telecentric optical arrangement 24, the aperture stop 66 is positioned at this convergence point, i.e., at the focal length F1 of the object assembly.

The off-focus telecentric optical arrangement 24 is further depicted as having a distance L1 between the image assembly and the aperture stop and a distance L2 between the image assembly 64 and the detector 76. The aperture stop 66 is also characterized as having a major dimension 86. Herein, the "major dimension" 86 is the diameter of a circular aperture or the largest dimension of a non-circular aperture (e.g., the diagonal of a rectangular aperture).

In one embodiment, the distance L1 is substantially equal to the focal length of the image assembly 64, such that the radiation transferred by the image assembly 64 to the detector 76 is substantially collimated. This arrangement is herein referred to as a "bilateral" telecentric optical arrangement. In a bilateral telecentric arrangement, not only is the radiation collected through the object assembly 62 substantially collimated, but the radiation transferred from the image assembly 64 to the detector 76 is also substantially collimated (as depicted in the figures). An advantage of collimating the radiation transferred from the image assembly 64 to the detector 76 is that additional stray light is rejected. Such scattered radiation can originate on the surfaces of the various optical components in the system, as well as off-axis radiation that enters the radiation thermometer 22. The collimation of the radiation between the image assembly 64 and the detector 76 rejects more of the radiation entering the image assembly 64 at angles that are not parallel to the optical axis 68.

In one embodiment, the distance L2 can also be substantially equal to the focal length of the image assembly 64. However, L2 is not constrained to any particular dimension in a bilateral telecentric optical arrangement.

A ray bundle 88 is characterized as a cluster of rays including a central or "chief" ray 92, all originating from an infinitesimal point 94 on the target 72. The ray bundle 88 comprises all the rays originating from the infinitesimal point 94 that are within a solid angle 96 centered about the chief ray 92. The chief ray 92 is parallel to but offset from the optical axis 68. Each infinitesimal point 94 within the target area 74 emits a similar bundle of rays that are collected by the object assembly 62.

The solid angle 96 is a function of the major dimension 86 and a target distance L3, which is the distance from a forward-most surface 98 of the object assembly 62 to the target 72. The smaller the solid angle 96 of the ray bundle 88, the closer the rays in the ray bundle 88 are to being parallel with the optical axis 68, and the greater the rejection of stray light. For a given target distance L3, the smaller the major dimension 86 the smaller the solid angle 96. Also, for a given major dimension 86 of the aperture stop 66, a longer target distance L3 will provide a smaller solid angle 96 for enhanced rejection of stray light. Generally, the target distance L3 is not of specified dimension because of the off-focus, parallel ray collection. Non-limiting examples of the target distance L3 for MOCVD chambers is less than two meters. In one embodiment, the target distance L3 is substantially the focal length of the object assembly 62. In one embodiment, the target distance L3 is on the order of 200 mm to 300 mm (for example, 250 mm).

The artisan will recognize that there is a tradeoff between the magnitude of the solid angle 96 required and the magnitude of the target area 74 required to achieve a given signal-to-noise ratio. That is, for a given target distance L3, smaller solid angles 96 (e.g., smaller major dimensions 86) can be utilized for larger target areas 74, generally enhancing the rejection of stray radiation, whereas larger solid angles 96 (e.g., larger major dimensions 86) are required for smaller target areas 74. Target size is limited by other factors, including the dimension of the view port window 52, the effective radial dimension of the image assembly 64, and the desired field of view of the target 72 on the wafer carrier 32. Thus, for smaller target areas 74 that require a larger major dimension 86 of the aperture stop 66, and at shorter target distances L3, the stray light rejection of the off-focus telecentric optical arrangement 24 can be vitiated.

In certain non-limiting embodiments, the major dimension 86 of the aperture stop 66 is approximately ⅓ or less of the effective radial dimension 65 of the object assembly 62. In one embodiment, the major dimension 86 of the aperture stop 66 is in the range of 1 mm to 20 mm.

For a typical target of crystalline growth material, inter-reflected radiation that is reflected from the target 72 has a strong specular component. That is, a large fraction of the radiation incident on the surface of the crystalline growth structure will be reflected at the same angle as the angle of incidence. Accordingly, a disproportionate amount of the stray radiation that enters standard radiation thermometers (i.e., one without at telecentric optical arrangement) is reflected off the target 72 at angles that are not parallel to the optical axis 68. Accordingly, by reducing the solid angle 96 of the ray bundle 88, the contribution of stray radiation is also substantially reduced.

Consider the orientation of the radiation thermometer 22 in FIG. 2. Radiation that is specularly reflected from the target 72 and into the radiation thermometer 22 must have first been inter-reflected or emitted from the view port window 52. The viewport can be configured to reduce the amount of reflected radiation therefrom, for example by the use of antireflective coatings and/or by disposing the view port window 52 within the recess 54, which can be actively cooled, to limit the amount of radiation incident upon the view port window 52.

Consider the orientation of the radiation thermometer 22 in FIG. 3. The light trap 82, arranged as generally described and as depicted in FIG. 3, functions to trap radiation that would otherwise be incident on the target 72 at the angle of specular reflection for the optical axis 68. The light trap 82 can also be configured as discussed above—e.g., with an antireflective window within a recess 54—to limit transfer of inter-reflected radiation onto the target 72.

To verify the theory of operation of the off-focus telecentric optical arrangement 24, the geometry and operating conditions of the enclosure 30 as substantially depicted in FIG. 2 and described herein was modeled using the Advanced System Analysis Program (ASAP), a three-dimensional ray tracing program provided by the Breault Research Organization, Inc. of Tucson, Ariz., U.S.A. The ASAP model was executed to identify stray radiation paths and to analyze stray radiation entering the view port window 52. The peripheral heating element 45 was set as a radiation source operating at a temperature of 1800° C. The wafer carrier 32 (modeled as including wafers in the wafer pockets 35) was modeled as both a radiation source at 800° C. and as a scattering media. The wafer pockets 35 were assumed to be carrying wafers having an emittance of 0.8 at the wavelengths of interest. The blackbody emissive power for the radiation sources was established based on Planck's law at a wavelength of 405 nm. The interior walls of the enclosure 30 (including the body shutter 42, laminar flow plates 31 and view port window 52 were also modeled as scattering media.

The radiation thermometer 22 was modeled for two different collection optics: a "standard" optical arrangement having a target diameter of 10 mm at a 1:1 magnification; and the off-focus telecentric optical arrangement as depicted and described herein, with a target diameter of approximately 30 mm. The amount of 405 nm radiation emitted from the target 24 and directly entering the radiation thermometer 22 ("signal radiation") was compared with the amount of 405 nm radiation inter-reflected within the enclosure 30 and entering the radiation thermometer 22 ("stray radiation") for each optical arrangement. The results are presented in Table 1.

TABLE 1

ASAP model results predicting the fraction of radiation wavelength attributed to signal and stray radiation at 405 nm for a standard and a telecentric optical arrangement (target at 800° C.; peripheral heating element at 1800° C.)

|  | Standard Optics | Off-Focus Telecentric Optics |
|---|---|---|
| Signal Radiation | 30% | 61% |
| Stray Radiation | 70% | 39% |
| Temperature Error at 405 nm wavelength | 41° C. | 16° C. |

The ASAP model predicted that, for a radiation thermometer utilizing standard optics, about 70% of the radiation flux at the 405 nm wavelength on the detector is attributed to stray radiation. Utilization of the off-focus telecentric optical arrangement 24, however, reduced the stray radiation contribution to 39%. These stray light contributions cause temperature bias errors of approximately 41° C. and 16° C., respectively. That is, the bias error of the temperature measurement for the off-focus telecentric optical arrangement 24 is almost ⅔ less for the off-axis telecentric optical arrangement than for a standard lens system.

Figure 5:
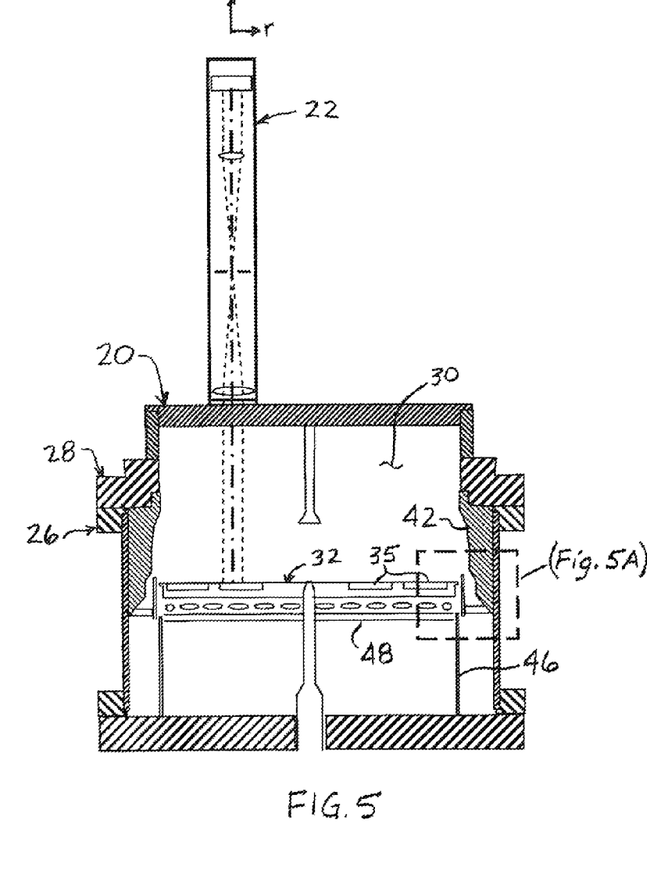
FIG. 5 is a sectional view of an off-focus telecentric radiation thermometer operatively coupled to a MOCVD chamber utilizing a flow extender in an embodiment of the invention.
Figure 5A:
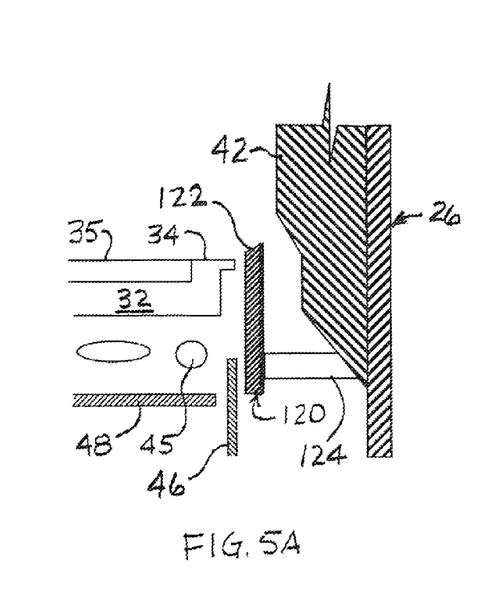
FIG. 5A is an enlarged partial sectional view of the MOCVD chamber and flow extender of FIG. 5.

Referring to FIGS. 5 and 5A, the performance of the off-focus telecentric optical arrangement 24 was also verified experimentally. For this experiment, a MOCVD reactor system utilizing a flow extender 120. The flow extender 120 includes an upper end 122 that extends above the top surface 34 of the wafer carrier 32 and is attached to the body shutter 42 using connectors 124. Flow extenders are utilized to improve the flow and thermal characteristics crystalline growth environment, but also tend to dramatically increase the stray radiation signal received by radiation thermometers viewing the wafer carrier and wafers. The reactor system was operated at approximately 800° C. for an extended period of time with the wafer carrier (including GaN crystalline growth material in the wafer pockets) so that the thermal environment within the enclosure was at quasi-steady state (i.e., the components of the MOCVD reactor system were thermally saturated). A measurement with a radiation thermometer was made with the resistance heating array energized. Then, the power to the resistance heating array was cut, and a second measurement made with the radiation thermometer within a ten second time period. At the 405 nm wavelength, the stray radiation from the resistance heating array ceases almost immediately upon the power being cut, whereas the target continues to emit radiation at essentially the same emissive power as immediately prior to the power termination because of the thermal capacitance of the target. Accordingly, it was assumed that the first measurement included a stray radiation component from the resistance heating array at the 405 nm wavelength, whereas the second measurement did not. The experiment was performed for both a standard optical pyrometer utilizing a standard in-focus optical arrangement, as well as for a radiation thermometer utilizing the off-focus telecentric optical arrangement 24. Both radiation thermometers were operated nominally at the 405 nm wavelength. The results are presented in Table 2.

TABLE 2

Measurement results estimating the fraction of radiation wavelength attributed to signal and stray radiation at 405 nm for a standard and a telecentric optical arrangement (target at 800° C.; chamber with flow extender)

|  | Standard Optics | Off-Focus Telecentric Optics |
|---|---|---|
| Signal Radiation | 36% | 69% |
| Stray Radiation | 64% | 31% |
| Temperature Error at 405 nm wavelength | 34° C. | 12° C. |

The measurement results show that, for a radiation thermometer utilizing standard optics, about 64% of the radiation flux at the 405 nm wavelength on the detector is attributed to stray radiation. Utilization of the off-focus telecentric optical arrangement 24, on the other hand, reduced the stray radiation contribution to about 31%. These stray light contributions cause temperature bias errors of approximately 34° C. and 12° C., respectively. Again, the bias error of the temperature measurement for the off-focus telecentric optical arrangement 24 is about ⅔ less for the off-axis telecentric optical arrangement than for a standard lens system.

In one embodiment, the detector 76 comprises a photon counter (i.e., photomultiplier tube, or PMT) having a cut off wavelength of 700 nm, and thus is insensitive to infrared radiation. Therefore, the use of a PMT as the detector largely eliminates the concerns of inadequate filtering in the infrared portion of the spectrum identified in Zettler. A filtering device 102 can be used to filter the PMT so that only wavelengths primarily in the region of blue, violet or ultraviolet light are detected.

Another advantage of the PMT is the fast time response that it provides, which is a factor for CVD chambers that utilize high rotational speeds of the wafer carrier, such as the TURBODISC systems manufactured by Veeco Instruments of Somerset, N.J., U.S.A. The TURBODISC system is described generally at Mitrovic, et. al., "Reactor Design Optimization Based on 3D CFD Modeling of Nitrides Deposition in MOCVD Vertical Rotating Disc Reactors," June 2005 (available at http://www.wpi.edu/academics/che/HMTL/CFD_in_CRE_IV/Mitrovic.pdf, last visited 16 Jun. 2012). The high rotation rates of such systems can require data acquisition rates from the radiation detector 76 on the order of 10 kHz, which PMTs can provide.

Non limiting examples of the spectra transmitted by the filtering device includes a center wavelength in the range of 380 nm to 420 nm and a band width (full width at half maximum) in the range of 10 nm to 70 nm. In one embodiment, the filtering device 102 further comprises a band pass filter in combination with a colored glass filter. A non-limiting example of a filter combination is the 10BPF25-400 band pass filter from Newport (center wavelength of 400±3.5 nm; full width at half maximum of 25±3.5 nm) with a FGB25 colored glass filter from Thorlabs (local cut-off wavelength of 400 nm), which combine to define a primary band pass that passes radiation nominally in the 390 nm to 420 nm band pass.

In one embodiment, a non-limiting example of the component sizing and layout for the off-focus telecentric optical arrangement 24 includes: the object assembly 62 comprising a plano-convex lens having a 50.8 mm diameter and a focal length of 249.2 mm (e.g., LA1301-A from Thorlabs, Inc.) located a distance F1 of 249.2 mm from the aperture stop 66; the image assembly 64 comprising a plano-convex lens having a 25.4 mm diameter and a focal length of 75.0 mm (e.g., LA1608-A from Thorlabs, Inc.) located at a distance L1 of 75 mm from the aperture stop 66 and a distance L3 of 75 mm from the detector. In another embodiment, the object assembly 62 further comprises an achromatic doublet having a 50.8 mm diameter and a focal length of 100 mm (e.g., AC508-100-A from Thorlabs) in combination with the plano-convex lens above to shorten the focal length F1 of the object assembly to approximately 87 mm, as well as to shorten the overall length of the assembly. In this latter arrangement, an achromatic doublet having a shorter focal length (e.g., 30 mm) can, for example, be utilized as the image assembly 64 for closer proximity to the aperture (e.g., AC254-030-A from Thorlabs).

The lenses in the above-referenced examples can comprise any material suitable for transmitting radiation in the visible and/or ultraviolet portions of the electromagnetic spectrum, such as borosilicate glass, barium fluoride and fused silica. They can also be coated with antireflective coatings.

Alternatively, other filtering devices and techniques can be implemented in combination with the off-focus telecentric optical arrangement 24 presented herein. For example, the detector and filtering arrangement Zettler can be implemented. In some embodiments, a water cooled CCD or a solid state detector such as an avalanche photodiode can be utilized.

In operation, the wafer carrier is rotated about the rotation axis 40 while being radiantly heated by the heating array 44. The rotation rate of the wafer carrier 32 about the rotation axis 40 can vary substantially, depending on the operating parameters and design criteria of the MOCVD reactor system 20. PMT The radiation thermometer 22 and off-focus telecentric optical arrangement 24 of the invention is not limited to systems that implement heating sources other than resistance-type heaters. The various embodiments of the invention can be utilized, for example, some CVD reactor systems utilize microwave heating sources.

The following references are hereby incorporated by reference in their entirety except for express definitions and patent claims contained therein: U.S. Patent Application Publication No. 2011/0064114 to Zettler et al.; Petrozzo et al., "Telecentric Lenses Simplify Non-Contact Metrology," Test & Measurement World, Oct. 15, 2001; Mitrovic, et. al., "Reactor Design Optimization Based on 3D CFD Modeling of Nitrides Deposition in MOCVD Vertical Rotating Disc Reactors," June 2005 (available at http://www.wpi.edu/academics/che/HMTL/CFDin_CRE_IV/Mitrovic.pdf, last visited 16 Jun. 2012); co-pending U.S. patent application Ser. No. 13/531,220, entitled "Control of Stray Radiation in a CVD Chamber," naming Guray Tas and Jing Zhou inventors and filed on even date herewith.

References to relative terms such as upper and lower, front and back, left and right, or the like, are intended for convenience of description and are not contemplated to limit the invention, or its components, to any specific orientation. All dimensions depicted in the figures may vary with a potential design and the intended use of a specific embodiment of this invention without departing from the scope thereof.

Each of the additional figures and methods disclosed herein may be used separately, or in conjunction with other features and methods, to provide improved devices, systems and methods for making and using the same. Therefore, combinations of features and methods disclosed herein may not be necessary to practice the invention in its broadest sense and are instead disclosed merely to particularly describe representative embodiments of the invention.

For purposes of interpreting the claims for the present invention, it is expressly intended that the provisions of Section 112, sixth paragraph of 35 U.S.C. are not to be invoked unless the specific terms "means for" or "step for" are recited in the subject claim.

What is claimed is:

1. A metalorganic chemical vapor deposition system, comprising:
   a telecentric optical arrangement for a radiation thermometer tailored to reduce the effects of stray radiation on a temperature measurement of a target, said telecentric optical arrangement including:
      an aperture stop;
      an object assembly of one or more optical components arranged for transfer of radiation to said aperture stop, said object assembly and said aperture stop defining an optical axis, said object assembly defining a first focal length relative to a first reference point within said object assembly, said first reference point being located on said optical axis at a distance from said aperture stop that is substantially equal to said first focal length of said object assembly for transfer of said radiation from said target through said object assembly and for focusing said radiation from said target onto said aperture stop, said object assembly disposed within a recess at a depth sufficient to limit the amount of stray radiation incident upon the object assembly; and
      an electromagnetic radiation detector arranged to generate a signal representing said temperature measurement of said target from at least a portion of said radiation transferred from said object assembly through said aperture stop to said electromagnetic radiation detector;
   said telecentric optical arrangement being mounted above a wafer carrier and oriented to view said target supported by a top surface of said wafer carrier at a distance such that said radiation transferred from said target to said object assembly is off-focus.

2. The metalorganic chemical vapor deposition system of claim 1, further comprising an image assembly of one or optical components disposed opposite said object assembly from said aperture stop and arranged to receive radiation transferred from said object assembly through said aperture stop along said optical axis, said image assembly defining a second local length relative to a second reference point within said image assembly, said second reference point being located on said optical axis.

3. The metalorganic chemical vapor deposition system of claim 2, wherein said second reference point of said image assembly is located at a distance from said aperture stop that is substantially equal to said second focal length of said image assembly.

4. The metalorganic chemical vapor deposition system of claim 1, wherein said aperture stop defines a major dimension that is approximately ⅓ or less of an effective radial dimension of said object assembly.

5. The metalorganic chemical vapor deposition system of claim 1, wherein said electromagnetic radiation detector is a photon counter having a cutoff wavelength of approximately 700 nm.

6. The metalorganic chemical vapor deposition system of claim 1, further comprising a filtering device having a primary hand pass at wavelengths less than 450 nm, said filtering device being arranged to filter radiation incident on a sensing region of said electromagnetic radiation detector.

7. The metalorganic chemical vapor deposition system of claim 6, wherein said primary band pass of said filtering device has a center wavelength in the range of 380 nm to 420 nm and has a band width in the range of 20 nm to 50 nm.

8. The metalorganic chemical vapor deposition system of claim 6, wherein said filtering device comprises a band pass filter.

9. The metalorganic chemical vapor deposition system of claim 1, wherein a distance between said target and said object assembly is less than two meters.

10. The metalorganic chemical vapor deposition system of claim 1, wherein said object assembly comprises at least one lens.

11. A method of utilizing a telecentric lens arrangement for reducing stray radiation bias in a radiation thermometer to provide a temperature measurement of a target in a metalorganic chemical vapor deposition chamber, comprising:
   providing a telecentric lens arrangement including an aperture stop and a first optical component assembly for collecting radiation from said target, said telecentric optical lens arrangement being mounted above a wafer carrier and oriented to view said target supported by a top surface of a wafer carrier at a distance such that said radiation transferred from said target to said object assembly is off-focus, said telecentric lens arrangement being adapted for positioning said aperture stop at the focal length of said first optical component assembly for capture of radiation emitted from said target, said object assembly disposed within a recess at a depth sufficient to limit the amount of stray radiation incident upon the object assembly;

providing instructions on a tangible medium, said instructions comprising:

orienting said first optical component assembly to intercept radiation emitted from a target within said metalorganic chemical vapor deposition chamber.

12. The method of claim 11, wherein said instructions provided in the step of providing instructions further comprise positioning said aperture stop at the focal length of said first optical component assembly.

13. The method of claim 11, wherein said instructions provided in the step of providing instructions further comprising operatively coupling said telecentric lens arrangement with an electromagnetic radiation detector.

14. The method of claim 11, further comprising positioning said aperture stop at the focal length of said first optical component assembly.

15. The method of claim 11, further comprising operatively coupling said telecentric lens arrangement with an electromagnetic radiation detector.

16. A system for measuring a temperature of a target in a metalorganic chemical vapor deposition chamber, comprising:

a radiation thermometer operatively coupled with said metalorganic chemical vapor deposition chamber above a wafer carrier and oriented to view said target supported by a top surface of said wafer carrier at a distance such that said radiation transferred from said target to an object assembly is off-focus, said object assembly disposed within a recess at a depth sufficient to limit the amount of stray radiation incident upon the object assembly, and said radiation thermometer including means for defining said target inside said chemical vapor deposition chamber.

17. The metalorganic chemical vapor deposition system of claim 1, further comprising a light trap configured to limit transfer of stray radiation onto said target.

18. The metalorganic chemical vapor deposition system of claim 17, wherein said optical axis of said object assembly is positioned at an angle with respect to a surface of said target, and wherein said light trap is positioned at an angle corresponding to the specular reflection of said target surface.

* * * * *